United States Patent [19]
Sakaguchi et al.

[11] Patent Number: 5,837,624
[45] Date of Patent: Nov. 17, 1998

[54] WOVEN GLASS CLOTH FOR PRINTED WIRING BOARD AND PRINTED WIRING PRODUCTS MANUFACTURED THEREFROM

[75] Inventors: Kozo Sakaguchi, Tokyo; Fumio Nagamine; Keita Miyasato, both of Fukushima; Hiromasa Hattori, Kyoto; Tatsuya Watanabe; Akinori Hibino, both of Kouriyama, all of Japan

[73] Assignees: Matsushita Electric Works, Ltd., Osaka; Nitto Boseki Co., LTd., Fukushima, both of Japan

[21] Appl. No.: 730,393

[22] Filed: Oct. 15, 1996

[30] Foreign Application Priority Data

Oct. 16, 1995 [JP] Japan .................................. 7-267504

[51] Int. Cl.⁶ .............................. H05K 3/00; H05K 1/03
[52] U.S. Cl. .................. 442/208; 442/117; 442/175; 442/180; 442/218; 442/232; 442/233; 442/234; 139/420 C; 428/901
[58] Field of Search .................. 442/208, 218, 442/232, 234, 180, 117; 139/420 C; 428/209, 901

[56] References Cited

U.S. PATENT DOCUMENTS

| | | | |
|---|---|---|---|
| 3,669,158 | 6/1972 | Phillips | 139/420 C |
| 4,103,102 | 7/1978 | Klein | 139/420 C |
| 4,414,264 | 11/1983 | Olson | 139/420 C |
| 4,563,385 | 1/1986 | Bhatt et al. | 442/208 |
| 4,579,772 | 4/1986 | Bhatt et al. | 139/420 C |
| 4,696,853 | 9/1987 | Fourezon | 442/208 |
| 4,707,565 | 11/1987 | Kasai et al. | 174/68.5 |

FOREIGN PATENT DOCUMENTS

| | | |
|---|---|---|
| 4226208 | 2/1994 | Germany . |
| 54-10827 | 8/1979 | Japan . |
| 6-319245 | 1/1988 | Japan . |
| 3-249237 | 11/1991 | Japan . |
| 5-5243 | 1/1993 | Japan . |
| 5-64857 | 3/1993 | Japan . |
| 7-162156 | 6/1995 | Japan . |

OTHER PUBLICATIONS

English Language Abstract of JP–54–108270.
English Language Abstract of JP–3–249237.
English Language Abstract ofJP–7–162156.
English Language Abstract of DE 42 26208.
Patent Abstracts of Japan, vol. 17, No. 377 (M–1446), 15 Jul. 1993.
Patent Abstracts of Japan, vol. 17, No. 266 (C–1062), 25 May 1993.
Database WPI, Week 7940, Derwent Publications Ltd., London, GB AN 79–72674b, XP00202870.
Database WPI, Week 8810, Derwent Publications Ltd., London, GB AN 88–066539, XP00202871.
Patent Abstracts of Japan, vol. 16, No. 43 (C–0907), 4 Feb. 1992.
Patent Abstracts of Japan, vol. 95, No. 9, 31 Oct. 1995.
European Search Report and Annex.

*Primary Examiner*—Cathy F. Lam
*Attorney, Agent, or Firm*—Greenblum & Bernstein P.L.C.

[57] ABSTRACT

To enhance the tear strength without increasing the thickness, a woven glass cloth having a mass of 15 to 30 g/m², for use as a base material for printed wiring board material, is characterized in that the weft or warp is provided by a 75 denier or more strand, thicker than the warp, and thread count of the thicker strand per unit length is set smaller than that of the other strand.

13 Claims, 3 Drawing Sheets

GLASS CLOTH (SINGLE YARN)

GLASS CLOTH (SINGLE YARN)

GLASS CLOTH (TWO PLY YARN)

PREPREG

LAMINATE

WOVEN GLASS CLOTH FOR PRINTED WIRING BOARD AND PRINTED WIRING PRODUCTS MANUFACTURED THEREFROM

FIELD OF THE INVENTION

The present invention relates to a woven glass cloth to be used as a base material for printed wiring boards, a prepreg using the woven glass cloth as a base material, a laminate using this prepreg, and a multilayer printed wiring board using the prepreg and the laminate.

BACKGROUND OF THE INVENTION

In recent years, with the trends of electronic equipment toward higher functions as well as smaller weight, thickness, length and size, the printed wiring board has been rapidly advancing in terms of increased multilayers, thinner insulating layers, and higher densities. For these reasons, the materials making up the printed wiring board are strongly demanded for quality enhancements in moisture-absorbing and heat-resistant properties, high dimensional stability, long-term insulation reliability, and the like.

Meanwhile, the prepreg used for making up such a printed wiring board as described above is commonly provided by those prepared from a woven glass cloth impregnated, and dried, with a varnish of thermosetting resin. A laminate can be fabricated by stacking a plurality of prepregs and, as required, stacking a metal foil, and by subjecting them to a hot, pressure molding process. The laminate can be finished into a printed wiring board by performing printing or other processes on the metal foil of the laminate into circuit formation. Further, a multilayer board can be fabricated by stacking the prepregs on the surface of the printed wiring board, which is used as an inner-layer circuit board, by further stacking a metal foil on the exterior thereof, and by subjecting them to a hot, pressure molding process. Then the multilayer board can be finished into a multilayer printed wiring board by performing printing or other processes on the metal foil of the surface of the multilayer board into circuit formation.

In order to implement thinner type printed wiring boards in correspondence to the trends toward higher functions as well as smaller weight, thickness, length and size of electronic equipment as described above, it has been practiced that, with the use of a woven glass cloth having a thickness of not more than 0.06 mm, prepregs are prepared by using the lightweight woven glass cloth as the base material and further printed wiring boards are fabricated.

However, with the use of such a lightweight woven glass cloth, the laminate would yield tears and breaks to large extent with the action of external force in printed wiring board fabrication processes, such as etching process and blackening treatment process, because of insufficient strength of woven glass cloths. This would pose an issue that aimed printed wiring boards cannot be fabricated.

The present inventors made the following examinations with regard to this issue. First, a prepreg was prepared by using a 0.03 mm thick woven glass cloth with warp and weft equal in thickness, and an unclad board of single-sheet construction was fabricated from this prepreg, by which a sample S as shown in FIG. 1 was obtained (the numerical values in FIG. 1 are in mm) With regard to this sample S, tear strength was measured. In this case, the sample S had a cut-in 1 previously given parallel to the warp or the weft of the woven glass cloth, where the sample S with a cut-in given parallel to the warp would be torn by the weft being cut off. Therefore, it was assumed that a value in autograph resulting from tearing the sample S in the vertical direction as in FIG. 2 at a velocity of 10 mm/min was taken as the lateral tear strength, while a value resulting from the sample S with the cut-in 1 given parallel to the weft, conversely, was taken as the longitudinal tear strength. As a result of this, the values of longitudinal tear strength and lateral tear strength were both as low as 20 gf.

Meanwhile, a prepreg was prepared by using a 0.06 mm thick woven glass cloth with warp and weft equal in thickness, and an unclad board of single-sheet construction was fabricated from this prepreg, by which a similar sample S was obtained. With regard to this sample S, tear strength was measured likewise. The results were values of more than 40 gf.

As a result of the above, it has been found that the lightweight woven glass cloth is low in tear strength, which low tear strength could cause the tears and breaks in the printed wiring board fabrication processes. From this fact, the inventors got an idea that improvement in the tear strength of the woven glass cloth becomes effective in preventing tears and breaks in the printed board fabrication processes, and made researches on the strands constituting warp and weft as well as the weaving density with a view to increasing the tear strength of woven glass cloth. As a result, it was found that the tear strength depends largely on the weight of the strand, i.e., the thickness of the strand. This means that thicker strands as the warp or weft improves the value of tear strength so that the strength can be improved without changing the glass composition of the woven glass cloth. However, thick strands for both warp and weft would result in greater thickness of woven glass cloth, so that it is difficult to form a desired thin woven glass cloth.

From the above aspect, it may well be discussed to use a thick strand for either one of warp or weft. Among woven glass cloths in which either one of warp or weft is provided by a strand thicker than that of the other, there have conventionally been developed EP05A as shown in JIS R3414 and a Nitto Boseki Co., Ltd. woven glass cloth WE03G, in which a thick strand is used for warp in order to obviate strand breaking problem during a manufacturing process.

In those woven glass cloths in which either the warp or the weft uses a thick strand, however, the thread count of the thicker strand is larger than that of the other so that the mass of the woven glass cloth becomes large with the thickness increased. As a result, there have been issues that desired thin woven glass cloths could not be obtained or that laminates or printed wiring boards formed from the woven glass cloth would result in extremely poor dimensional stability.

SUMMARY OF THE INVENTION

The present invention has been accomplished in view of these and other issues. An object of the invention is therefore to provide a woven glass cloth which can be enhanced in tear strength without increasing the thickness. A further object of the invention is to provide a prepreg, a laminate, and a multilayer printed wiring board all of which can be fabricated without causing tears or breaks by using the woven glass cloth.

According to a first aspect of the present invention, there is provided a woven glass cloth comprising warps and wefts and having a mass of 15 to 30 g/m$^2$, for use as a base material for printed wiring board material, wherein the weft is provided by a 75 denier or more strand, thicker than warp, and that thread count per unit length of strands of the weft is set smaller than that of the warp.

In an preferred embodiment, the thread count per unit length of strands of the weft is 0.3 to 0.8 time that of the warp and the weight per unit length of strands of the weft is 1.5 to 2.5 times that of the warp.

According to a second aspect of the present invention, there is provided a woven glass cloth comprising warps and wefts and having a mass of 15 to 30 g/m$^2$, for use as a base material for printed wiring board material, characterized in that warp is provided by a 75 denier or more strand, thicker than weft, and that thread count per unit length of strands of the warp is set smaller than that of the weft.

In an preferred embodiment, the thread count per unit length of strands of the warp is 0.3 to 0.8 time that of the weft and the weight per unit length of strands of the warp is 1.5 to 2.5 times that of the weft.

In another embodiment, at least one of the warp and the weft comprises a two ply yarn or single yarn having a filament diameter of 0.003 to 0.010 mm.

According to a third aspect of the present invention, there is provided a prepreg which comprises the woven glass cloth according to the present invention impregnated with resin, wherein the resin is a thermosetting resin. Preferably, the thermosetting resin is epoxy resin. The amount of the resin with which the woven glass cloth is impregnated is preferably 60 to 80% by weight relative to weight of the prepreg alone comprising the resin and glass cloth.

In a preferred embodiment, the prepreg has a thickness of 0.040 to 0.080 mm.

According to a fourth aspect of the present invention, there is provided a laminate which is obtained by adding a metal foil to the prepreg according to the present invention and by subjecting them to a hot, pressure molding process, wherein an insulating layer except the metal foil after the molding has a thickness of 0.040 to 0.080 mm, preferably 0.040 to 0.060 mm.

In a preferred embodiment, the insulating layer except the metal foil after the molding has a tear strength of 35 gf or more.

According to a fifth aspect of the present invention, there is provided a multilayer printed wiring board characterized by being formed by using the prepreg according to the present invention as well as the laminate according to the present invention and metal foils for wiring.

BRIEF DESCRIPTION OF THE DRAWINGS

The above and other objects and features of the present invention will become more apparent from the following description of preferred embodiments thereof with reference to the accompanying drawings, throughout which like parts are designated by like reference numerals, and wherein:

FIG. 3 B is a sectional view of the two ply yarn woven glass cloth according to the present invention;

DISCLOSURE OF THE INVENTION

Figure 1:
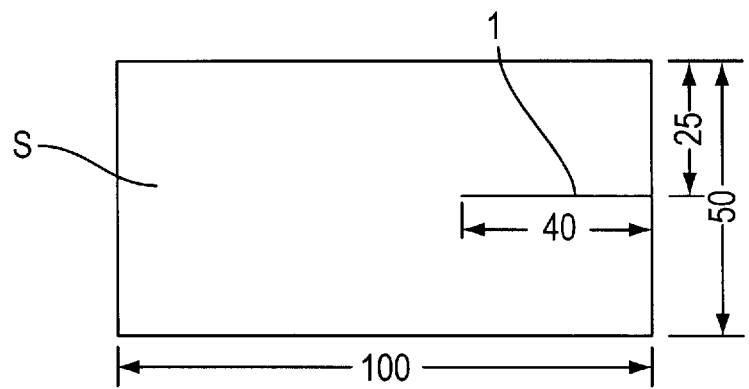
FIG. 1 is a view showing the dimensions of the sample.
Figure 2:
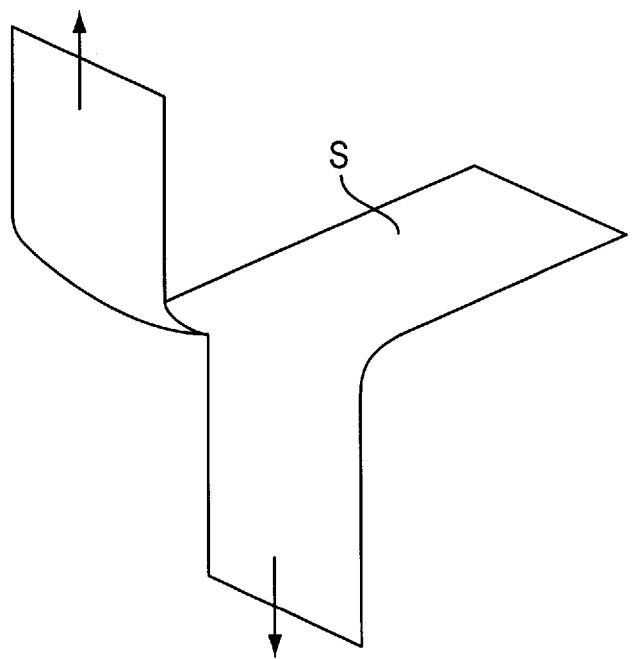
FIG. 2 is a view showing the tear test.
Figure 3A:
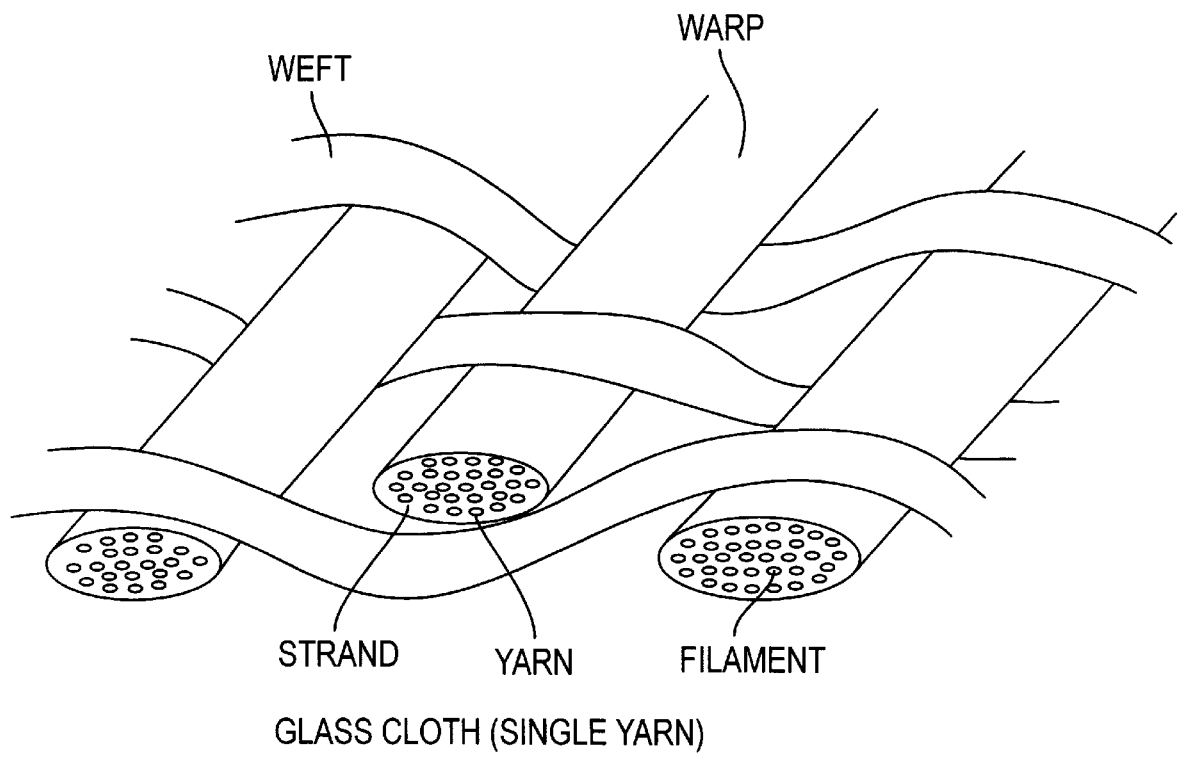
FIG. 3 A is a perspective schematic view of the woven glass cloth (single yarn) according to the present invention.
Figure 3B:
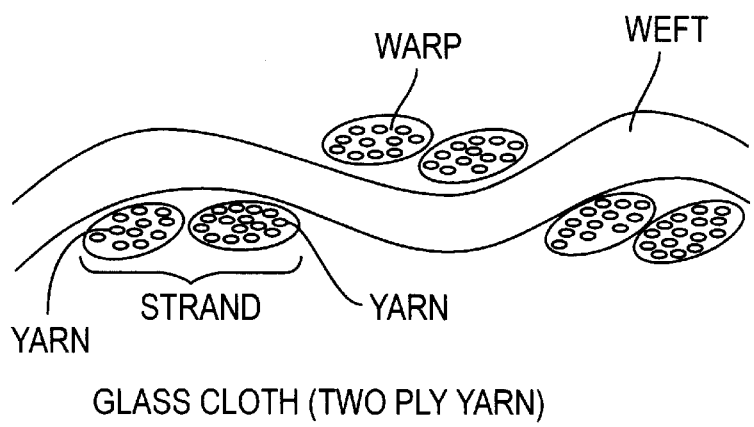
Figure 4:
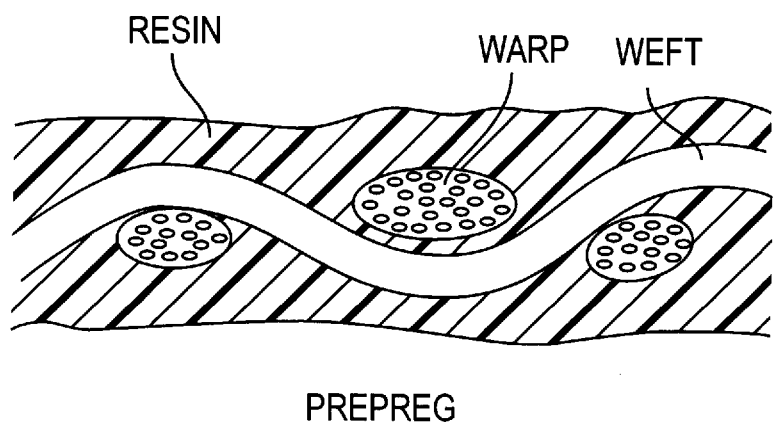
FIG. 4 is a sectional view of the prepreg according to the present invention.
Figure 5:
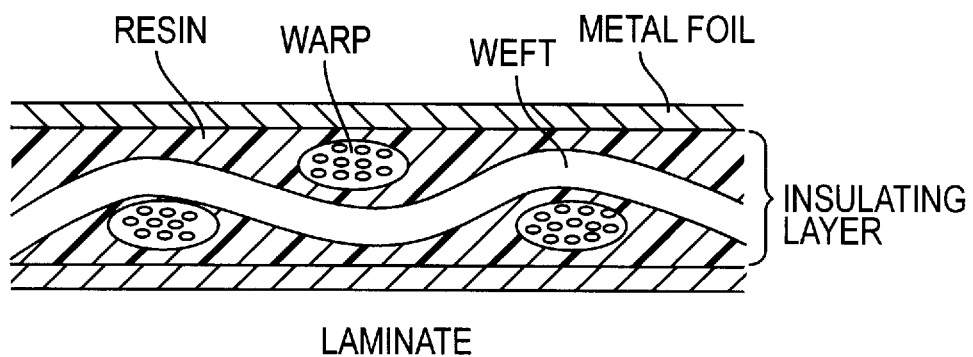
FIG. 5 is a sectional view of the laminate according to the present invention.

Hereinbelow, embodiments of the present invention are explained.

The woven glass cloth according to the present invention is formed by weaving strands into warp and -weft, as a lightweight woven glass cloth having a mass within a range of 15 to 30 g/m$^2$. If the mass exceeds 30 g/m$^2$, the glass woven cloth would be so thick that a desired thin woven glass cloth could not be obtained. Conversely, if the mass is less than 15 g/m$^2$, the woven glass cloth would be too thin to be practical in terms of strength. Although the woven glass composition of the strand is not particularly limited, use of E-glass in particular is preferable. Available weaves include plain weave, diagonal weave, Turkish satin weave, imitation gauze weave, leno weave, and the like, where the weave, although not particularly limited, is required to assure enough amount of impregnant resin.

Preferably, the above strand is composed of two ply yarn or single yarn having a filament diameter of 0.003 to 0.010 mm (more preferably, 0.005 to 0.007 mm). This is because, with the filament diameter over 0.010 mm, it would be necessary to decrease the number of filaments constituting the yarn in order to maintain the weight of strand unchanged, such that the drilling processibility in the printed wiring board fabrication process would be deteriorated. With the filament diameter under 0.003 mm, the yield of yarn fabrication would be poor, resulting in increased cost.

In the present invention, either one of the weft or the warp is formed from a strand thicker than that of the other. Taking a case, by way of example, in which the thicker strand is used as the weft, the thicker strand of the weft is preferably not less than 75 denier (8.4 g/km). Use of a strand with thickness not less than 75 denier allows the woven glass cloth to be enhanced in tear strength, while strands of less than 75 denier could not obtain the tear strength enhancing effect of woven glass cloth. The upper limit of the weft strand thickness, although not particularly set, is desirably not more than 100 denier (11.2 g/km) for practical use.

When a strand as thick as not less than 75 denier is used as the weft as described above, the thread count per unit length of strands of the weft is set smaller than the thread count per unit length of strands of the warp. In this case, the thread count per unit length of strands of the weft is preferably set to 0.3 to 0.8 time that of strands of the warp. That is, if the thread count per unit length of strands of the weft exceeds 0.8 time the thread count of the warp, the mass of the woven glass cloth may exceed 30 g/m$^2$ such that a desired lightweight woven glass cloth cannot be obtained. Conversely, with the thread count per unit length of strands of the weft is less than 0.3 time that of the warp, it is no longer possible to obtain enough tear strength enhancing effect by using a thicker strand as the weft.

The weight per unit length of strands of the weft is preferably 1.5 to 2.5 times the weight per unit length of the warp. That is, if the weight per unit length of strands of the weft is less than 1.5 times that of the warp, the strength of the weft would lack so that the tear strength enhancing effect may not be obtained enough. If the weight per unit length of strands of the weft exceeds 2.5 times that of the warp, it would be necessary to decrease the thread count of the weft in order to maintain the mass of the woven glass cloth within the range of 15 to 30 g/m$^2$, where the strength of the woven glass cloth as a whole may be lowered.

Although the above description has been made on the case in which a thicker strand is used as the weft, this is the case also when a thicker strand is used as the warp (where the terms "weft" and "warp" may be replaced with each other in reading the above description).

Then, with the woven glass cloth prepared so that the above conditions are satisfied, a prepreg can be fabricated by impregnating the woven glass cloth with resin varnish and by heating and drying them.

The resin for prepregs may be general thermosetting resins such as epoxy resin, phenol resin, unsaturated polyester resin, melamine resin, and polyimide resin, where epoxy resin is preferable among others. In impregnating the woven glass cloth with resin, the amount of resin in the prepreg is preferably set so as to fall within a range of 60 to 80% by weight relative to the weight of prepreg alone (i.e., 60 to 80 parts by weight of resin on the basis of 100 parts by weight of prepreg). In more detail, less than 60% by weight of resin would result in too thin a prepreg because of too small an amount of resin, while more than 80% by weight of resin would cause mold slipping to be likely to occur due to the fluidity of resin in the molding process because of too large an amount of resin.

The thickness of the prepreg is preferably in a range of 0.040 to 0.080 mm. More specifically, less than 0.040 mm thickness of prepreg would be too small a thickness of prepreg. Conversely, more than 0.080 mm thickness of prepreg would result in too large a product thickness of fabricated laminates or multilayer printed wiring boards, where thin type products would be difficult to implement.

Further, laminates can be fabricated by using this prepreg. More specifically, a laminate can be fabricated by stacking a sheet of prepreg or, as required, a plurality of prepregs, and as required, further stacking a metal foil on the exterior of them, and by subjecting them to a hot, pressure-molding process. The metal foil may be a foil of copper, aluminum, nickel, or iron alone, or a foil of alloys of these metals, or a foil of their composites, where the copper foil is preferable among others.

The thickness of the insulating layer except the metal foil (layer of prepreg limitation) of the laminate obtained in this way is preferably within a range of 0.040 to 0.080 mm. More specifically, less than 0.040 mm thickness of the insulating layer would result in an insufficient electrical insulating property of the insulating layer, while more than 0.080 mm thickness of the insulating layer would result in so large a thickness of the insulating layer that a desired thin type printed wiring board or multilayer printed wiring board could not be attained.

The tear strength of the insulating layer except the metal foil after the molding of the laminate is preferably not less than 35 gf. This is because, with the tear strength less than 35 gf, tears or breaks may occur in the laminate during the printed wiring board fabrication process, such as etching process and blackening treatment process. Use of the woven glass cloth described above as a base material makes it possible to obtain an insulating layer of the laminate having a tear strength of not less than 35 gf.

Then, by performing printing and other processes on the metal foil of this laminate into circuit formation, the laminate can be finished into a printed wiring board. Moreover, with this printed wiring board serving as an inner-layer circuit board, a multilayer board can be fabricated by stacking prepregs on the surface of the inner-layer circuit board, by further stacking a metal foil such as copper foil on the exterior of the prepregs, and by subjecting them to a hot, pressure molding process. Furthermore, the multilayer board can be finished into a multilayer printed wiring board by performing printing and other processes on the metal foil of the surface of the multilayer board into circuit formation.

EXAMPLES

Now the present invention is described with reference to examples thereof.

(Example 1)

As the woven glass cloth, an E-glass cloth having the composition and thread count of warp and weft as well as the unit weight (mass) as shown in "A" in Table 1 was used.

The woven glass cloth was impregnated with epoxy resin varnish having a composition of Table 2 and then heated and dried at 150° C. for 5 minutes, and the solvent was removed, by which a prepreg with a resin amount of 65% by weight and a melt viscosity of 300 poise was obtained. The thickness of this prepreg was 0.060 mm.

Next, an 18 $\mu$m copper foil was overlaid on one sheet of this prepreg on its top and bottom, followed by a hot, pressure molding process under the conditions of temperature 170° C., pressure 30 kg/cm$^2$, and time 70 minutes. Thus, a double-copper-clad glass epoxy laminate was obtained.

(Example 2)

As the woven glass cloth, an E-glass cloth having the composition and thread count of warp and weft as well as the unit weight (mass) as shown in "B" in Table 1 was used.

The woven glass cloth was impregnated with epoxy resin varnish having the composition of Table 2 and then dried in the same way as in Example 1, except that the amount of resin was set to 80% by weight, by which a prepreg with a thickness of 0.075 mm was obtained. Further, by using this prepreg, a double-copper-clad glass epoxy laminate was obtained in the same way as in Example (Example 3)

As the woven glass cloth, an E-glass cloth having the composition and thread count of warp and weft as well as the unit weight as shown in "C" in Table 1 was used.

The woven glass cloth was impregnated with polyimide resin varnish having a composition of Table 3 and then heated and dried at 150° C. for 5 minutes, and the solvent was removed, by which a prepreg with a resin amount of 68% by weight was obtained. The thickness of this prepreg was 0.070 mm.

Next, an 18 $\mu$m copper foil was overlaid on one sheet of this prepreg on its top and bottom, followed by a hot, pressure molding process under the conditions of temperature 170° C., pressure 50 kg/cm$^2$, and time 90 minutes. Thus, a double-copper-clad glass polyimide laminate was obtained.

(Example 4)

As the woven glass cloth, an E-glass cloth having the composition and thread count of warp and weft as well as the unit weight (mass) as shown in "D" in Table 1 was used.

Then, a prepreg was fabricated in the same way as in Example 1, and further a double-copper-clad glass epoxy laminate was obtained in the same way as in Example 1.

(Comparative Examples 1 to 3)

As the woven glass cloth, each E-glass clothes having the composition and thread count of warp and weft as well as the unit weight (mass) as shown in "E, F and G" in Table 1 was used. The strand F is EP05A in JIS R3414 and the strand G is WE03G available from Nitto Boseki Co., Ltd. in Japan.

Then, a prepreg was fabricated in the same way as in Example 1, and further a double-copper-clad glass epoxy laminate was obtained in the same way as in Example 1.

TABLE 1

| Type of Strand | | Warp | Weft | Thread Count, pcs/25 mm Warp | Weft | Unit weight, g/m² |
|---|---|---|---|---|---|---|
| A | Filament diameter, μm | 5 | 5 | 56 | 42 | 26.2 |
|   | Filament count | 102 | 152 | | | |
|   | Denier (g/km) | 50 (5.6) | 75 (8.4) | | | |
| B | Filament diameter, μm | 5 | 5 | 56 | 28 | 24.8 |
|   | Filament count | 102 | 200 | | | |
|   | Denier (g/km) | 50 (5.6) | 100 (11.2) | | | |
| C | Filament diameter, μm | 5 | 5 | 60 | 36 | 29.5 |
|   | Filament count | 102 | 102 | | | |
|   | Denier (g/km) | 50 (5.6) | 100 (11.2) | | | |
| D | Filament diameter, μm | 5 | 5 | 42 | 56 | 26.2 |
|   | Filament count | 152 | 102 | | | |
|   | Denier (g/km) | 75 (8.4) | 50 (5.6) | | | |
| E | Filament diameter, μm | 5 | 5 | 56 | 56 | 24.9 |
|   | Filament count | 102 | 102 | | | |
|   | Denier (g/km) | 50 (5.6) | 50 (5.6) | | | |
| F | Filament diameter, μm | 5 | 5 | 60 | 35 | 32.2 |
|   | Filament count | 200 | 102 | | | |
|   | Denier (g/km) | 100 (11.2) | 50 (5.6) | | | |
| G | Filament diameter, μm | 5 | 5 | 48 | 30 | 28.6 |
|   | Filament count | 200 | 102 | | | |
|   | Denier (g/km) | 100 (11.2) | 50 (5.6) | | | |

TABLE 2

| | |
|---|---|
| Tetrabromobisphenol A type epoxy resin (epoxy equivalent 500 g/eq; solid content 75 wt %) | 900 g |
| Phenol novolak type epoxy resin (epoxy equivalent 210 g/eq; solid content 75 wt %) | 150 g |
| Dicyan diamide | 20 g |
| 2-ethyl-4-methyl imidazole | 0.7 g |
| Dimethyl formamide | 200 g |
| Methyl ethyl ketone | 70 g |

TABLE 3

| | |
|---|---|
| N,N'-dimethyl acetamide | 400 g |
| Bismaleimide | 550 g |
| Diamino diphenylmethane | 160 g |

Thicknesses of the insulating layers of the double-copper-clad glass laminates obtained in Examples 1 to 4 and Comparative Example 1 were measured. Also, lateral tear strength was measured with respect to the insulating layer portion which is the rest of removing the copper foil of the double-copper-clad glass laminates obtained in Examples 1 to 4 and Comparative Example 1. Further, a line test was carried out by using these double-copper-clad glass laminates in an etching process line of an actual factory. The method of evaluation in the line test was that when ten sheets of a double-copper-clad glass laminate were passed at a velocity of 1.0 m/min through a 2 m long apparatus which blows an etching solution to both sides of the laminate from upper and lower nozzles at a spray pressure of 1.0 kg/cm², those which did not yield breaks or tears were accepted. The results are shown in Table 4.

TABLE 4

| | Example | | | | Comparative Example | | |
|---|---|---|---|---|---|---|---|
| | 1(A) | 2(B) | 3(C) | 4(D) | 1(E) | 2(F) | 3(G) |
| Thickness of insulating layer (mm) | 0.055 | 0.075 | 0.060 | 0.055 | 0.050 | 0.065 | 0.060 |
| Tear strength (gf) | 35 | 40 | 38 | 35 | 22 | 20 | 17 |
| Line test (acceptance count/total count) | 10/10 accepted | 10/10 accepted | 10/10 accepted | 10/10 accepted | 2/10 accepted | 1/10 | 0/10 |

As seen in Table 4, it can be verified that the products of Examples fabricated by using woven glass cloths that satisfy the conditions as defined in the present invention have high tear strengths so that their handlability and processibility can be improved.

(Example 5)

The copper foil on both sides of the double-copper-clad glass epoxy laminate obtained in Example 2 was subjected to printing and wiring processes to form a signal circuit, and further the surface of the signal circuit was blackened, by which an inner-layer circuit board was fabricated.

Then, prepregs obtained in Example 2 were overlaid on both front and rear sides of the inner-layer circuit board one for each side, and an 18 μm thick copper foil was overlaid on their exteriors of the lamination, respectively. This product was subjected to a hot, pressure molding process under the conditions of temperature 170° C., pressure 50 kg/cm², time 70 minutes, by which a four-layer board was fabricated. Further, an outer-layer circuit was formed by performing a print wiring process with through hole plating, resist, and the like. The final percent defective due to tears and breaks during the process of manufacturing the multilayer printed wiring board was 20%.

(Comparative Example 4)

A multilayer printed wiring board was fabricated in the same way as in Example 5 except that the double-copper-clad glass epoxy laminate and prepreg obtained in Comparative Example 1 were used. In this case, the final percent defective due to tears and breaks during the process of manufacturing the multilayer printed wiring board was 95%.

As apparent from the description, provided that the woven glass cloth having a mass of 15 to 30 g/m², and comprising either one of warps and wefts by of a 75 denier strand, thicker than the other strand, and that thread count of the thicker strand per unit length is set smaller than that of the other strand, the woven glass cloth can be enhanced in its tear strength by using the 75 denier or more thick strand. Yet, the woven glass cloth can be prevented from being thickened by setting the thread count of the thicker strand per unit length smaller than that of the other strand.

Further, the woven glass cloth having the thread count of the thicker strand per unit length of strands of the weft 0.3 to 0.8 time that of the other strand, can obtain enough tear strength enhancing effect without increasing the thickness of the woven glass cloth.

Furthermore, the woven glass cloth having the weight of the thicker strand per unit length 1.5 to 2.5 times that of the other strand, can obtain enough effect of enhancing the tear strength of the woven glass cloth while the strength of the woven glass cloth as a whole is maintained.

The woven glass cloth wherein the strand of the warp or the weft comprises a two ply yarn or single yarn having a filament diameter of 0.003 to 0.010 mm, can enhance the drilling processability in the printed wiring board fabrication process.

The prepreg comprising the woven glass cloth as described above impregnated with the thermosetting resin, can obtain high tear strength.

Further, the prepreg wherein the thermosetting resin is epoxy resin, makes it possible to obtain a laminate having high heat resistance.

Furthermore, the prepreg wherein amount of the resin with which the woven glass cloth is impregnated is 60 to 80% by weight relative to unit weight of the prepreg, can be used for the molding of laminates without any possibility that molding slipping may occur.

The prepreg having a thickness of 0.040 to 0.080 mm, makes it possible to mold thin type laminates and printed wiring boards.

The laminate which is obtained by adding a metal foil to the prepreg as described above and by subjecting them to a hot, pressure molding process, has an insulating layer except the metal foil after the molding has a thickness of 0.040 to 0.080 mm, so that a thin type laminate can be obtained.

Further, the laminate wherein the insulating layer except the metal foil after the molding has a tear strength of 35 gf or more, can be prevented from yielding tears and breaks in the process of printing the laminate.

The multilayer printed wiring board according to the present invention, characterized by being formed by using the prepreg as described above as well as the laminate and the metal foil as described above, can be formed into a thin type multilayer printed wiring board without any possibility that tears or breaks may occur.

What is claimed is:

1. A woven glass cloth comprising warps and wefts and having a mass of 15 to 30 g/m², suitable for use as a base material to be resin-impregnated for printed wiring board material, wherein one of the warps and the wefts comprise strands having a denier of 75 or more, said strands having a denier of 75 or more being thicker than strands of the other of the warps and the wefts, and a thread count of the thicker strands per unit length is set smaller than that of the other strands.

2. The woven glass cloth according to claim 1, wherein the thread count per unit length of said thicker strands is 0.3 to 0.8 time that of the other strands.

3. The woven glass cloth according to claim 1, wherein the thicker strands have a weight per unit length 1.5 to 2.5 times that of the other strands.

4. A woven glass cloth according to claim 1, wherein the thicker strands are wefts.

5. The woven glass cloth according to claim 1, wherein at least one of the warps and the wefts comprise two ply yarn or single yarn having a filament diameter of 0.003 to 0.010 mm.

6. A prepreg comprising a woven glass cloth impregnated with resin, suitable for use as a base material for printed wiring board material, wherein the woven glass cloth comprises warps and wefts and has a mass of 15 to 30 g/m², one of the warps and the wefts comprise strands having a denier of 75 or more, said strands having a denier of 75 or more being thicker than strands of the other of the warps and the wefts, and a thread count of the thicker strands per unit length is set smaller than that of the other strands, and the resin comprises a thermosetting resin.

7. The prepreg according to claim 6, wherein the thermosetting resin is an epoxy resin.

8. The prepreg according to claim 6, wherein amount of resin with which the woven glass cloth is impregnated is 60 to 80% by weight relative to a total weight of the resin and woven glass cloth.

9. The prepreg according to claim 8, wherein a thickness of the prepreg is 0.040 to 0.080 mm.

10. A laminate suitable for use as a printed wiring board material, which comprises at least one prepreg laminated with at least a metal foil for wiring and to be subjected to a hot, pressure molding process, wherein the at least one prepreg comprises a thermosetting resin-impregnated woven glass cloth comprising warps and wefts and having a mass of 15 to 30 g/m², one of the warps and the wefts comprise strands having a denier of 75 or more, said strands having a denier of 75 or more being thicker than strands of the other of the warps and the wefts, and a thread count of the thicker strands per unit length is set smaller than that of the other strands, and the laminated at least one prepreg not including the metal foil, after molding has a thickness of 0.040 to 0.080 mm as an insulating layer of the resulting laminate.

11. The laminate according to claim 10, wherein the insulating layer has a thickness of 0.040 to 0.060 mm.

12. The laminate according to claim 10, wherein the insulating layer has a tear strength of 35 gf or more.

13. A multilayer printed wiring board comprising an inner printed wiring board, at least one prepreg for an insulating layer and at least one metal foil for wiring which are laminated and subjected to a hot, pressure molding process, wherein the at least one prepreg comprises a woven glass cloth impregnated with resin, the woven glass cloth comprising warps and wefts and having a mass of 15 to 30 g/m², one of the warps and the wefts comprise strands having a denier of 75 or more, said strands having a denier of 75 or more being thicker than strands of the other of the warps and the wefts, and a thread count of the thicker strands per unit length is set smaller than that of the other strands.

* * * * *